United States Patent
Bhagwagar et al.

(10) Patent No.: US 11,732,175 B2
(45) Date of Patent: Aug. 22, 2023

(54) NON-CURABLE THERMALLY CONDUCTIVE PITUITOUS SILICONE MATERIAL

(71) Applicant: Dow Silicones Corporation, Midland, MI (US)

(72) Inventors: Dorab Bhagwagar, Saginaw, MI (US); Cassie Hale, Auburn, MI (US); Peng Wei, Shanghai (CN); Qianqing Ge, Shanghai (CN); Yan Zheng, Shanghai (CN); Zhanjie Li, Midland, MI (US)

(73) Assignee: DOW SILICONES CORPORATION, Midland, MI (US)

( * ) Notice: Subject to any disclaimer, the term of this patent is extended or adjusted under 35 U.S.C. 154(b) by 0 days.

(21) Appl. No.: 18/005,678

(22) PCT Filed: Oct. 28, 2020

(86) PCT No.: PCT/CN2020/124316
§ 371 (c)(1),
(2) Date: Jan. 17, 2023

(87) PCT Pub. No.: WO2022/087878
PCT Pub. Date: May 5, 2022

(65) Prior Publication Data
US 2023/0212447 A1 Jul. 6, 2023

(51) Int. Cl.
*C09K 5/14* (2006.01)
*C08K 7/18* (2006.01)
*C08K 3/22* (2006.01)
*C08G 77/12* (2006.01)
*C08G 77/22* (2006.01)
*C08G 77/08* (2006.01)
*C08K 3/08* (2006.01)

(52) U.S. Cl.
CPC ............... *C09K 5/14* (2013.01); *C08G 77/08* (2013.01); *C08G 77/12* (2013.01); *C08G 77/22* (2013.01); *C08K 3/22* (2013.01); *C08K 7/18* (2013.01); *C08K 2003/0812* (2013.01); *C08K 2003/2227* (2013.01); *C08K 2003/2296* (2013.01); *C08K 2201/001* (2013.01); *C08K 2201/005* (2013.01); *C08K 2201/014* (2013.01)

(58) Field of Classification Search
None
See application file for complete search history.

(56) References Cited

U.S. PATENT DOCUMENTS

| | | | |
|---|---|---|---|
| 5,654,362 | A | 8/1997 | Schulz, Jr. et al. |
| 6,015,777 | A | 1/2000 | Lostritto, Jr. et al. |
| 6,936,686 | B2 | 8/2005 | Awad |
| 8,119,191 | B2 | 2/2012 | Bunyan et al. |
| 8,796,190 | B2 | 8/2014 | Kato et al. |
| 2008/0269084 | A1 | 10/2008 | Matsumoto et al. |
| 2010/0105582 | A1 | 4/2010 | Joffre et al. |
| 2010/0275440 | A1 | 11/2010 | Paisner et al. |

FOREIGN PATENT DOCUMENTS

| | | |
|---|---|---|
| WO | 2014124367 | 8/2014 |
| WO | 2019067340 | 4/2019 |

*Primary Examiner* — Robert T Butcher
(74) *Attorney, Agent, or Firm* — Steven W. Mork

(57) ABSTRACT

A non-curable thermally conductive material contains: (a) a matrix material containing: (i) 90 to 98 wt % of a non-functional non-crosslinked organosiloxane fluid having a dynamic viscosity of 50 to 350 centiStokes; and (ii) 2 to less than 10 wt % of a crosslinked hydrosilylation reaction product of an alkenyl terminated polydiorganosiloxane having a degree of polymerization greater than 300 and an organohydrogensiloxane crosslinker with 2 or more SiH groups per molecule where the molar ratio of SiH groups to alkenyl groups is 0.5 to 2.0; (b) greater than 80 wt % to less than 95 wt % thermally conductive filler dispersed throughout the matrix material; and (c) treating agents selected from alkyltrialkoxy silanes where the alkyl contains one to 14 carbon atoms and monotrialkoxy terminated diorganopolysiloxanes having a degree of polymerization of 20 to 110 and the alkoxy groups each contain one to 12 carbon atoms dispersed in the matrix material.

10 Claims, No Drawings

NON-CURABLE THERMALLY CONDUCTIVE PITUITOUS SILICONE MATERIAL

FIELD OF THE INVENTION

The present invention relates to a thermal interface material (TIM) that is a non-curable thermally conductive pituitous silicone material.

INTRODUCTION

Thermally interfacing materials (TIMs) are thermally conductive materials useful for enhancing the thermal coupling between two components in a device, such as in an electronic device. Including a TIM between, for example, a heat source and a heat sink can enhance the efficiency of transferring heat from the heat source to the heat sink compared to contacting the heat source and heat sink without having a TIM between them.

TIMs can be non-curable greases or curable compositions. Non-curable greases are easier to implement because they do not need special storage conditions and do not need to be cured after application. Typically, a non-curable grease is applied to one component by a method such as stencil or screen printing and then another component is pressed against the thermal grease to thermally couple the two components through the TIM grease. Non-curable greases are convenient to apply, but remain flowable in the device and that can result in undesirable pump-out, particularly when the two components coupled by the TIM grease have different coefficients of thermal expansion causing them to move to different extents during thermal cycling. When the components coupled by a TIM grease move repeatedly, during power cycling for instance, and they move to different extents, then the mobile TIM grease can get squeezed out from between the two components, which is known as pump-out. Additionally, or alternatively the matrix material can be preferentially squeezed out relative to the thermally conductive filler resulting in phase separation. In either case, the thermal coupling of the TIM grease undesirably diminishes. As a result, TIM greases are often used in applications that indirectly thermally couple a heat source with a heat sink, typically through a housing (or "integrated heat spreader") of some kind around the heat source. Then the difference in temperature can be mitigated somewhat, the package can be stiffened, and the coefficient of thermal expansion can be matched more closely between the coupled components.

Curable TIMs are desirable for bare die coupling—that is coupling a heat source directly to a heat sink without going through a housing intermediary. Curable TIMs are sandwiched between two components to thermally couple them and then cured to reduce the mobility of the TIM and, typically, to enhance the adhesion to the components. Once cured, the TIM is less likely to undergo pump-out or phase separation than a non-curable TIM. However, curable TIMs require an extra step in device manufacturing—curing of the TIM. Also, curable TIMs require care during storage prior to use to preclude premature curing. As a result, they are often supplied as two-component systems that need to be mixed just prior to use. One-component curable systems require special storage conditions such as storage in freezers to inhibit premature curing. Furthermore, assembly of thermally coupled parts using curable TIMs must be conducted immediately and entirely at the same location because once a TIM cures further handling and mating to the TIM is not feasible, particularly at the typical TIM bond line thickness of 0.2 to 0.3 millimeters. That inhibits flexibility from supply chain and manufacturing perspectives. Non-curable TIM greases avoid all of those challenges.

It would be desirable to identify a TIM that is a non-curable grease for ease of storage and device manufacturing yet that can be applied in bare die applications without concerns for pump-out or phase separation. In particular, it is desirable to identify a non-curable TIM grease that has a thermal conductivity greater than one Watt per meter*Kelvin (W/m*K), preferably 2 W/m*K or more and even more preferably 5 W/m*K or more while at the same time has a viscosity of less than 150 Pascal*seconds (Pa*s) in order to have desirable printability, while at the same time having excellent pump-out resistance as determined by development of less than 5% void space on a die surface after 5000 thermal cycles in a Pump-Out Resistance test (defined herein below).

BRIEF SUMMARY OF THE INVENTION

The present invention provides a TIM that is a non-curable grease for ease of device manufacturing yet that can be applied in bare die applications without concerns for pump-out or phase separation. In particular, it provides a non-curable TIM grease that has a thermal conductivity greater than one Watt per meter*Kelvin (W/m*K), preferably 2 w/m*K or more and even more preferably 5 W/m*K or more while at the same time has a viscosity of less than 150 Pascal*seconds (Pa*s) in order to have desirable printability, while at the same time having excellent pump-out resistance as determined by development of less than 5% void space on a die surface after 5000 thermal cycles in a Pump-Out Resistance test (defined herein below).

The present invention is a result of discovering that a non-curable thermal grease can be made having pituitous properties by dispersing thermally conductive filler in a carrier matrix comprising 2 to less than 10 weight-percent (wt %) of crosslinked polysiloxane with greater than 90 wt % to 98 wt % of a different non-functional non-crosslinkable polysiloxane, with wt % relative to carrier matrix weight. The small amount of crosslinked polysiloxane creates the pituitous properties and inhibits the matrix from suffering from pump-out or phase separation when used as a TIM in bare die applications. The crosslinked component in the carrier matrix is sufficient to stabilize the composition from pump-out and support distributed thermally conductive filler yet, surprisingly, not high enough to inhibit stenciling or printing of the composition onto components. Moreover, the resulting composition is stable to curing and requires no special storage or handling, nor does it require curing after application to a component.

In a first aspect, the present invention is a non-curable thermally conductive material comprising: (a) a matrix material comprising: (i) greater than 90 weight-percent and at the same time 98 weight percent or less based on matrix material weight of a non-functional non-crosslinked organosiloxane fluid having a dynamic viscosity in a range of 50 to 350 centiStokes; and (ii) 2 to less than 10 weight-percent based on matrix material weight of a crosslinked hydrosilylation reaction product of an alkenyl terminated polydiorganosiloxane having a degree of polymerization that is greater than 300 and an organohydrogensiloxane crosslinker comprising on average 2 or more SiH groups per molecule where the ratio of the alkenyl terminated polydiorganosiloxane and organohydrogen siloxane is such that the molar ratio of SiH groups to alkenyl groups is in a range of 0.5 to 2.0; (b) greater than 80 weight-percent and at the same time less than 95 wt % based on non-curable thermally conductive material weight of a thermally conductive filler dispersed throughout the matrix material; and (c) treating agents selected from alkyltrialkoxy silanes where the alkyl contains from one to 14 carbon atoms and monotrialkoxy terminated diorganopolysiloxanes having a degree of polymerization in a range of 20 to 110 and the alkoxy groups each contain from one to 12 carbon atoms dispersed in the matrix material.

In a second aspect, the present invention is a process comprising applying the non-curable thermally conductive material of the first aspect to an object such as a bare die or heat sink.

In a third aspect, the present invention is an article comprising the non-curable thermally conductive material of the first aspect in thermal contact with at least two objects, such as a bare die and a heat sink.

The non-curable thermal conductive material of the present invention is useful as a non-curable TIM grease in electronic applications, especially for directly thermally coupling a bare die to a heat sink.

DETAILED DESCRIPTION OF THE INVENTION

Test methods refer to the most recent test method as of the priority date of this document when a date is not indicated with the test method number. References to test methods contain both a reference to the testing society and the test method number. The following test method abbreviations and identifiers apply herein: ASTM refers to ASTM International methods; EN refers to European Norm; DIN refers to Deutsches Institut fur Normung; ISO refers to International Organization for Standards; and UL refers to Underwriters Laboratory.

Products identified by their tradename refer to the compositions available under those tradenames on the priority date of this document.

"Multiple" means two or more. "And/or" means "and, or as an alternative". All ranges include endpoints unless otherwise indicated. Unless otherwise stated, all weight-percent (wt %) values are relative to composition weight and all volume-percent (vol %) values are relative to composition volume.

"Bare die" refers to an exposed integrated circuit on silicon that does not have an integrated heat spreader.

"Kinematic viscosity" for individual polysiloxanes is determined by ASTM D 445 using a glass capillary Cannon-Fenske type viscometer at 25 degrees Celsius (° C.) unless otherwise stated.

"Viscosity at dilation" refers to the viscosity of a material at dilatant strain (dilatant point) as measured as a dynamic viscosity using ASTM D4440-15 and model ARES-G2 device by TA Instruments that is equipped with 25 millimeter parallel plates (serrated steel). Testing conditions are based on strain sweep conducted at 25 degrees Celsius (° C.) with Strain: 0.01-300% and Frequency of 10 radians per second. Record the dynamic viscosity at the dilatant strain (dilatant point) as the viscosity at dilation.

Determine chemical structure for polysiloxanes by standard $^1H$, $^{13}C$ and $^{29}Si$ nuclear magnetic resonance (NMR) analysis. Determine average particle size for filler particles as the median particle size (D50) using laser diffraction particle size analyzers (CILAS920 Particle Size Analyzer or Beckman Coulter LS 13 320 SW) according to the operation software.

In one aspect, the present invention is a non-curable thermally conductive material that comprises a matrix material, a thermally conductive filler and treating agents.

"Non-curable" means the matrix material of the composition is free of a combination of functionalities necessary to undergo chemical crosslinking by hydrosilylation or condensation, preferably that the composition is free of functionality to undergo crosslinking by any chemical reaction that is thermally or chemically induced. In that regard, the matrix material is desirably free of a combination of alkenyl and silyl-hydride (SiH) functionalities, as well as free of alkoxy functionalities. Desirably, the organosiloxane materials the matrix material only contain alkyl and/or aryl groups terminal and pendant thereto.

"Thermally conductive" means that the non-curable thermally conductive material has a thermal conductivity that is greater than one Watt per meter*Kelvin (W/m*K), preferably 2 W/m*K or more, and even more preferably 5 W/m*K or more. Determine thermal conductivity of the non-curable thermally conductive material as described in the Examples section herein below.

The matrix material comprises, and can consist of, a non-functional non-crosslinked organosiloxane fluid ("carrier fluid") and a crosslinked hydrosilylation reaction product.

The non-functional non-crosslinked organosiloxane fluid ("carrier fluid") is a fluid, which means it has a kinematic viscosity of 50 centiStokes (cSt) or more, 75 cSt or more, 100 cSt, 125 cSt or more, 150 cSt or more, 175 cSt or more, 200 cSt or more, 250 cSt or more, even 300 cSt or more while at the same time desirably has a kinematic viscosity of 350 cSt or less, 300 cSt or less, 250 cSt or less, 200 cSt or less, 150 cSt or less, even 100 cSt or less. "Non-functional" means the organosiloxane fluid is free of alkenyl groups, silyl-hydride groups, silanol groups and alkoxy groups. Desirably, the carrier fluid is a fluid polyorganosiloxane that only has alkyl and/or aryl terminal and pendent groups. "Non-crosslinked" means the organosiloxane fluid is free of multiple chemical bonds joining any two polymer chains.

The carrier fluid is desirably a linear organopolysiloxane. Linear organopolysiloxanes comprise primarily, preferably entirely, $R_3SiO_{1/2}$ siloxane units and $R_2SiO_{1/2}$ siloxane units where each R is independently selected from alkyl and/or aryl groups. The linear organopolysiloxane can comprise up to 3 mole-percent (mol %), preferably 2 mol % or less, one mol % or less and can be free of $RSiO_{3/2}$ and $SiO_{4/2}$ siloxane units relative to all siloxane units in the linear organopolysiloxane. The carrier fluid can be a polydimethylsiloxane (PDMS) or preferably is a PDMS with a methyl on some of the $R_2SiO_{1/2}$ siloxane units replaced with a phenyl group (thereby forming a phenylmethylsiloxane-dimethylsiloxane copolymer). The phenylmethylsiloxane-dimethylsiloxane copolymer can contain 5 mol % or more, 7 mol % or more, even 9 mol % or more and at the same time typically contains 15 mol % or less, 14 mol % or less, 13 mol % or less, even 12 mol % phenylmethylsiloxane units relative to all siloxane units in the copolymer.

One example of a suitable carrier fluid is phenylmethylsiloxane-dimethylsiloxane copolymer having a kinematic viscosity of 100 centiStokes and comprising 9-12 mol % phenylmethyl siloxane units, available as PMM-1021 from Gelest.

The carrier fluid makes up the majority of the matrix material and is present at a concentration of greater than 90 weight-percent (wt %) or more, 91 wt % or more, 92 wt % or more, 94 wt % or more, even 96 wt % or more while at the same time 98 wt % or less, even 96 wt % or less or 94 wt % or less of the matrix material weight.

The crosslinked hydrosilylation reaction product is a crosslinked hydrosilylation reaction product of an alkenyl terminated polydiorganosiloxane and an organohydrogensiloxane crosslinker.

The alkenyl terminated polydiorganosiloxane (PDOS) can be a single PDOS with alkenyl termination or can be a chain extended polymer of multiple PDOS chains that is alkenyl terminated. As such, the alkenyl terminated PD PDOS MS has the following general chemical structure (I):

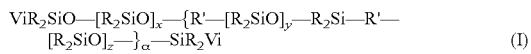

$$ViR_2SiO—[R_2SiO]_x—\{R'—[R_2SiO]_y—R_2Si—R'—[R_2SiO]_z—\}_\alpha—SiR_2Vi \qquad (I)$$

The component in "{ }" arises by joining multiple PDOS chains by hydrosilylation chain extension. Chain extension occurs with a hydrosilylation reaction between a PDOS with an alkenyl terminal group and a PDOS with a silylhydride terminal group. If the alkenyl terminated PDOS is a single PDOS chain that has not been chain extended then subscript a is zero.

In chemical structure (I):

Vi is a vinyl group;

R is independently in each occurrence selected from alkyl and aryl groups, preferably alkyl and aryl groups having from one to 8 carbon atoms, and most preferably is methyl in each occurrence;

R' is a bivalent alkylene group having 2 or more and can have 3 or more, 4 or more, even 6 or more and generally has 10 or fewer, 8 or fewer, 6 or fewer, even 4 or fewer carbon atoms;

Subscript α desirably has an average value of zero but can have a value of zero or more and can be one or more, even 2 or more and at the same time is generally 10 or fewer, 9 or fewer, 8 or fewer, 7 or fewer, 6 or fewer, 5 or fewer, 4 or fewer, 3 or fewer and can be 2 or fewer, even one or fewer;

Subscripts x, y and z each independently have a value of 10 or higher, 20 or m higher or 30 or higher, 40 or higher, 50 or higher, 75 or higher, 100 or higher, 150 or higher, 200 or higher, 250 or higher, 300 or higher, 350 or higher, 400 or higher, 450 or higher, 500 or higher, 550 or higher, 600 or higher, 650 or higher, 700 or higher, 750 or higher, 800 or higher, even 850 or higher while at the same time is desirably 900 or less, 850 or less, 800 or less, 750 or less, 700 or less, 650 or less, 600 or less, 550 or less, 500 or less, even 450 or less; wherein the value of (x+y+z) corresponds to the degree of polymerization (DP) for the alkenyl terminal PDMS and has a value of 300 or higher, preferably 350 or higher, 400 or higher, 450 or higher, 500 or higher, 550 or higher, 600 or higher, 650 or higher, 700 or higher, 750 or higher, 800 or higher, even 850 or higher while at the same time is desirably 900 or less, 850 or less, 800 or less, 750 or less, 700 or less, 650 or less, 600 or less, 550 or less, 500 or less, even 450 or less.

The organohydrogen siloxane crosslinker contains on average 2 or more SiH groups per molecule. The organohydrogen siloxane crosslinker can have chemical structure (II):

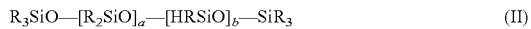

$$R_3SiO—[R_2SiO]_a—[HRSiO]_b—SiR_3 \qquad (II)$$

Where each R is independently in each occurrence selected from alkyl and aryl groups, preferably alkyl and aryl groups having from one to 8 carbon atoms; subscript a has an average value of 3 or more, 5 or more, 10 or more, 14 or more, 20 or more, 25 or more, 50 or more, even 75 or more while at the same time has an average value of 100 less, 75 or less, 50 or less, 25 or less, 20 or less, even 15 or less; and subscript b has an average value of 2 or more, 5 or more, 10 or more, 15 or more, even 20 or more while at the same time 30 or less, 25 or less, 20 or less, even 15 or less. Desirably, R is methyl (—CH$_3$) in each occurrence.

The crosslinked hydrosilylation reaction product is a result of reacting the alkenyl terminated polydiorganosiloxane and organohydrogensiloxane crosslinker together at a concentration such that the molar ratio of SiH groups to alkenyl groups is 0.5 or more, 1.0 or more, even 1.5 or more and at the same time 2.0 or less and can be 1.5 or less in the presence of a hydrosilylation catalyst. Generally, the hydrosilylation catalyst is a platinum catalyst such as Karstedt's catalyst and/or Speier's catalyst (H$_2$PtCl$_6$). Karstedt's catalyst is an organoplatinum compound derived from divinyl containing disiloxane (1,1,3,3,-tetramethyl, 1,3-divinyldisiloxane). The hydrosilylation catalyst can (and typically does) remain in the matrix material of the non-curable thermally conductive material of the present invention or the catalyst can be removed after forming the crosslinked hydrosilylation reaction product and not be present in the matrix material. Catalyst is typically present in the matrix material at a platinum metal concentration of 0.5 weight parts per million (ppm) or more, 1.0 ppm or more, 2.0 ppm or more, 3.0 ppm or more, 4.0 ppm or more, 5.0 ppm or more, 10 ppm or more, 15 ppm or more 20 ppm or more, 30 ppm or more, even 40 ppm or more while at the same time is typically present at a concentration of 50 ppm or less, 40 ppm or less, 30 ppm or less, 20 ppm or less, 10 ppm or less, 5 ppm or less, 4 ppm or less, 3 ppm or less, 2 ppm or less, even one ppm or less based on matrix weight.

The crosslinked hydrosilylation reaction product is typically present in the matrix material at a concentration of 2 wt % or more, 3 wt % or more 4 wt % or more, 5 wt % or more, 6 wt % or more, 7 wt % or more, 8 wt % or more, even 9 wt % or more while at the same time less than 10 wt %, and can be 9 wt % or less, 8 wt % or less, 7 wt % or less, 6 wt % or less, 5 wt % or less, 4 wt % or less, even 3 wt % or less with wt % relative to matrix material weight.

The crosslinked hydrosilylation reaction product and carrier fluid are desirably mixed so as to form a single composition, preferably a homogeneous composition, that forms a matrix in which the other components of the non-curable thermally conductive material are dispersed. In fact, the alkenyl terminated polydiorganosiloxane and organohydrogensiloxane crosslinker can be mixed with the non-functional non-crosslinked organosiloxane prior to reacting so that they undergo hydrosilylation crosslinking in the carrier fluid. That way, once the hydrosilylation crosslinking reaction is complete the crosslinked hydrosilylation reaction product is already mixed with the carrier fluid to form a matrix material without having to blend a crosslinked material into another fluid.

The non-curable thermally conductive material further comprises thermally conductive filler dispersed throughout the matrix material. The thermally conductive filler can be any useful in TIM materials. For instance, the thermally conductive filler can be any one or any combination of more than one thermally conductive filler selected from alumina, aluminum, zinc oxide, boron nitride, aluminum nitride, and aluminum oxide trihydrate. Desirably, the thermally conductive filler is any one or any combination of more than one selected from a group consisting of alumina, aluminum and zinc oxide. Even more desirably, the thermally conductive filler is any one or any combination or more than one filler selected from spherical aluminum particles having an average size of 8 to 10 micrometers, spherical aluminum particles having an average particle size of one to 3 micrometers, zinc oxide particles having an average particle size of 0.10 to 0.15 micrometers, alumina particles have an average particle size of 10 to 20 micrometers, and spherical alumina particles have an average particle size of one to 5 micrometers. Determine average particle size for filler particles as the median particle size (D50) using laser diffraction particle size analyzers (CILAS920 Particle Size Analyzer or Beckman Coulter LS 13 320 SW) according to the operation software.

The amount of thermally conductive filler is greater than 80 wt %, preferably 85 wt % or more, 90 wt % or more, 91 wt % or more, 92 wt % or more, even 93 wt % or more while at the same time is typically 95 wt % or less, 94 wt % or less, even 93 wt % or less, 92 wt % or less, 91 wt % or less or 90 wt % or less with wt % relative to non-curable thermally conductive material weight.

The non-curable thermally conductive material further comprises a treating agent. Treating agents are useful to assist dispersing and stabilizing the dispersion of filler particles in the matrix material. Desirably, the conductive material is one or more than one material selected from alkyltrialkoxy silanes and monotrialkoxy terminated diorganopolysiloxanes. Preferably, the alkyl of the alkyltrialkoxy silanes contain one more, and can contain 2 or more, 4 or more, 6 or more, 8 or more, 10 or more, even 12 or more carbon atoms while at the same time typically contain 14 or fewer, even 12 or fewer, 10 or fewer carbon atoms. Each alkoxy of the alkyltrialkoxy silanes desirably contain one or more and at the same time 6 or fewer, 4 or fewer, even 2 or fewer carbon atoms. One desirably alkyltrialkoxy silane is n-decyltrimethoxy silane. The monotrialkoxy terminated diorganopolysiloxane desirably has chemical structure (III):

R'$_3$SiO[R'$_2$SiO]$_m$Si(OR')$_3$.                                (III)

where each R' is independently in each occurrence selected from alkyl groups having from one to 12 carbon atoms, and subscript m corresponds to the degree of polymerization for the material and has a value of 20 or more, 30 or more, 40 or more, 60 or more 80 or more even 100 or more and desirably 110 or less. Desirably, R' in each occurrence is methyl (—CH$_3$) and more desirably, the average value for a is also in a range of 30 to 110. Desirably, the treating agent is a combination of n-decyltrimethoxy silane and monotrimethoxy terminated dimethylpolysiloxane having an average degree of polymerization of 110.

The amount of treating agent in the non-curable thermally conductive material is desirably 0.1 wt % or more, 0.5 wt % or more, 1.0 wt % or more, 1.5 wt % or more, even 2.0 wt % or more while at the same time is typically 3.0 wt % or less, 2.5 wt % or less, 2.0 wt % or less, even 1.0 wt % or less based on non-curable thermally conductive material weight.

Desirably, the non-curable thermally conductive material has a viscosity dilation of less than 150 Pascal*seconds (Pa*s) in order to have desirable printability. The viscosity dilation of the on-curable thermally conductive material typically is 150 Pa*s or less, and can be 125 Pa*s or less, 120 Pa*s or less, 110 Pa*s or less, 100 Pa*s or less, 75 Pa*s or less, 50 Pa*s or less, even 40 Pa*s or less while at the same time is typically 30 Pa*s or more, 40 Pa*s or more, and can be 50 Pa*s or more, 75 Pa*s or more, even 100 Pa*s or more.

Surprisingly and beneficially, the non-curable thermally conductive material has a thermal conductivity of greater than one Watt per meter*Kelvin (W/m*K), preferably 2 w/m*K or more and even more preferably 5 W/m*K. At the same time, the non-curable thermally conductive material has a viscosity at dilation of less than 150 Pa*s and demonstrates "good" printability in the Printability Test described herein below. The non-curable thermally conductive material demonstrates excellent pump-out resistance by developing less than 5% void space on a die surface after 5000 thermal cycles in a Pump-Out Test (defined below).

Without being bound by theory, one hypothesis regarding the present non-curable thermally conductive material is that the carrier fluid swells the crosslinked hydrosilylation reaction product to form a pituitous fluid that stabilizes the dispersion of thermally conductive filler particles from phase separating from the non-curable material and also inhibits pump-out behavior of the matrix material. Nonetheless, the non-curable thermally conductive material is still of a low enough viscosity to be printable for easy application to a substrate.

Prepare the non-curable thermally conductive material by: (a) combining the reactants for making the crosslinked hydrosilylation reaction product (that is, the alkenyl terminated polydiorganosiloxane and organhydrogensiloxane crosslinker) together with a hydrosilylation catalyst, the non-functional non-crosslinked organosiloxane fluid, the treating agent, and optionally, any or all of the thermally conductive filler; (b) crosslinking the reactants to make the crosslinked hydrosilylation reaction product in the presence of the treating agent and, optionally, the thermally conductive filler; and (c) mixing in the thermally conductive filler to a concentration of greater than 80 weight-percent and at the same time less than 95 wt % based on the weight of combined materials if not already at that concentration. Thermally conductive filler can be added during any one or any combination of steps (a)-(c). However, it is important to have non-functional non-crosslinked organosiloxane fluid and treating agent present during the hydrosilylation reaction that forms the crosslinked hydrosilylation reaction product of the matrix material so the crosslinked hydrosilylation reaction product is swollen with the non-functional non-crosslinked organosiloxane fluid.

The non-curable thermally conductive material can be part of a device where it resides between and thermally couples two objects. The non-curable thermally conductive material is particularly useful as a thermal interface material (TIM) for thermally coupling two objects, especially when one of the objects is a bare die and the other component is a heat sink. This is a particularly challenging coupling to maintain because the bare die tends to cycle through a large temperature and dimensional range in use and that can result in pump-out of TIM. Yet the present non-curable thermally conductive material is suitable for such an application.

The present invention includes a process comprising the step of applying the non-curable thermally conductive material to an object, such as a bare die or heat sink. The process can further include sandwiching the non-curable thermally conductive material between the object and a second object by applying a second component against the non-curable thermally conductive material and applying pressure. For instance, the non-curable thermally conductive material can be applied to an object that is a bare die or a heat sink and the other of a bare die or heat sink is applied to the non-curable thermally conductive material so that both the bare die and heat sink are thermally coupled to the non-curable thermally conductive material.

EXAMPLES

Table 1 lists the components for use with the present examples. SILASTIC, SYLOFF and DOWSIL are trademarks of The Dow Chemical Company.

TABLE 1

| Component | Description | Source |
|---|---|---|
| Alkenyl terminated polydiorganosiloxane (AT PDOS) 1 | vinyl dimethyl terminated PDMS with viscosity of 44,268 cSt and 0.088 wt % vinyl functionality, average degree of polymerization is 800, and having the following average chemical structure: $Vi(CH_3)_2SiO—[(CH_3)_2SiO]_{800}—Si(CH_3)_2Vi$. | SILASTIC ™ SFD 128 polymer from The Dow Chemical Company (TDCC) |
| AT PDOS 2 | vinyl dimethyl terminated PDMS with viscosity of 9,590 cSt and 0.134 wt % vinyl functionality, average degree of polymerization is 493, and having the following average chemical structure: $Vi(CH_3)_2SiO—[(CH_3)_2SiO]_{493}—Si(CH_3)_2Vi$. | SILASTIC ™ SFD 120 polymer from The Dow Chemical Company. |
| AT PDOS 3 | vinyl dimethyl terminated PDMS with viscosity of 2,157 cSt and 0.23 wt % vinyl functionality, average degree of polymerization is 292, and having the following average chemical structure: $Vi(CH_3)_2SiO—[(CH_3)_2SiO]_{292}—Si(CH_3)_2Vi$. | DMS-V31 from Gelest. |
| AT PDOS 4 | vinyl dimethyl terminated PDMS with viscosity of 430 cSt, 0.44 wt % vinyl functionality, average degree of polymerization is 179, and having the following average chemical structure: $Vi(CH_3)_2SiO—[(CH_3)_2SiO]_{179}—Si(CH_3)_2Vi$. | DOWSIL ™ SFD 119 fluid from TDCC. |
| Organohydrogensiloxane crosslinker 1 | An organohydrogensiloxane having a kinematic viscosity of 7.2 cSt. hydride content of 0.36 wt %, and the following average chemical structure: $(CH_3)_3SiO[(CH_3)_2SiO]_{8.7}[(CH_3)HSiO]_{3.7}Si(CH_3)_3$ | Synthesize according to teachings in: Advanced Materials Research Vol. 1133 (2016) pp 216-220. |
| Platinum Catalyst | Karstedt's Catalyst (1,1-diethenyl-1,1,3,3-tetramethyldisiloxane platinum complex) | SYLOFF ™ 4000 catalyst from TDCC. |
| Carrier Fluid 1 | Phenylmethylsiloxane-dimethylsiloxane copolymer, viscosity of 100 cSt and 9-12 mol % phenylmethyl siloxane units. | PMM-1021 from Gelest. |
| Carrier Fluid 2 | Trimethyl terminated PDMS, viscosity of 100 cSt | DOWSIL ™ 200 Fluid, 100 cSt from TDCC. |
| Carrier Fluid 3 | Trimethyl terminated PDMS with viscosity of 350 cSt | DOWSIL ™ 200 Fluid, 350 cSt from TDCC. |
| Treating Agent 1 | n-decyltrimethoxysilane | SID2670.0 from Gelest |
| Treating Agent 2 | $(CH_3)_3SiO[(CH_3)_2SiO]_{110}Si(OCH_3)_3$ | Synthesize according to teachings in US2006/0100336. |
| Treating Agent 3 | $(CH_3)_3SiO[(CH_3)_2SiO]_{30}(OCH_3)_3$ | Synthesize according to teachings in US2006/0100336. |
| Al-1 | Spherical aluminum particles having an average size of 9 micrometers. | TCP-9 from Toyal America. |
| Al-2 | Spherical aluminum particles having an average size of 2 micrometers. | TCP-2 from Toyal America. |
| ZnO-1 | Zinc oxide particles having an average size of 0.12 micrometers | Zoco102 from Zochem. |
| Alumina-1 | Roundish Alumina particles with an average particle size of 20 micrometers | A-SF-20 from Zhengahou Research Institute of Chalco, China. |
| Alumina-2 | Spherical Alumina particles with an average particle size of 2 micrometers. | A-Z2-75 from NIPPON STEEL Chemical & Material Col, Ltd. Micron Div., Japan. |
| Alumina-3 | Spherical Alumina particles with an average particle size of 10 micrometers. | DAW-10 from Denka Company in Japan. |
| Alumina-4 | Spherical Alumina particles with an average particle size of 4 micrometers. | DAW-03 from Denka Company in Japan. |
| Fumed Silica | Treated fumed silica with specific surface area of 200 square meters per gram. | Aerosil RDX200 from Nippon Aerosil Co. |
| Stabilizer | Copper phthaloxyanine powder (40 wt %) dispersed by 3-roll mill in trimethyl terminated PDMS, 350 cSt (60 wt %) | Copper Phalocyanaine from Alfa-Aesar (catalog number 43650-09) and PDMS from TDCC (DOWSIL ™ 200 Fluids, 350 cSt). |

Preparation of Matrix Material

MM1-MM10: Following the formulations in Table 2, which identify components in weight parts, prepare Matrix Materials (MM) 1-10 as follows: mix the Alkenyl terminated polydiorganosiloxane (AT PDOS) and Carrier Fluid 1 in a glass vial until homogeneous. Add the 3.3 weight-parts Treating Agent 1, 39 weight-parts Treating Agent 2 and 0.07 weight-parts Platinum Catalyst and mix. Slowly add with stirring the Organohydrogensiloxane crosslinker 1. After addition is complete, continue stirring for one day at 25° C. to allow the crosslinking reaction to complete. The resulting composition is the Matrix Material.

MM11: Prepare MM13 in like manner as MM1-MM12 except use 0.05 g Platinum Catalyst and do not include any Treating Agents.

TABLE 2

| Matrix Material | Carrier Fluid Identity | Carrier Fluid Weight-Parts | AT PDOS (weight-parts) | Organohydrogensiloxane crosslinker 1 (weight-parts) | Molar Ratio SiH/Vi |
|---|---|---|---|---|---|
| MM1 | 1 | 98 | AT PDOS1 (2 wt pts) | 0.03 | 1.4:1 |
| MM2 | 1 | 95 | AT PDOS1 (5 wt pts) | 0.07 | 1.4:1 |
| MM3 | 1 | 90 | AT PDOS1 (10 wt pts) | 0.15 | 1.4:1 |
| MM4 | 1 | 80 | AT PDOS1 (20 wt pts) | 0.30 | 1.4:1 |
| MM5 | 1 | 95 | AT PDOS1 (5 wt pts) | 0.03 | 0.5:1 |
| MM6 | 1 | 95 | AT PDOS1 (5 wt pts) | 0.05 | 1:1 |
| MM7 | 1 | 95 | AT PDOS1 (5 wt pts) | 0.10 | 2:1 |
| MM8 | 1 | 95 | AT PDOS 4 (5 wt pts) | 0.35 | 1.4:1 |
| MM9 | 1 | 95 | AT PDOS 3 (5 wt pts) | 0.20 | 1.4:1 |
| MM10 | 1 | 95 | AT PDOS 2 (5 wt pts) | 0.11 | 1.4:1 |
| MM11 | 3 | 91 | AT PDOS 2 (9 wt pts) | 0.13 | 1:1 |

Preparation of Non-Curable Thermally Conductive Material

I. Samples with Al-1, Al-2 and ZnO-1

Reference Sample A—Thermally Conductive Material with only Carrier Fluid matrix. Into a 100 milliliter (mL) dental cup, add 5.10 grams (g) Carrier Fluid 1, 0.17 g Treating Agent 1, 1.99 g Treating Agent 2, 50.25 g Al-1, 25.12 g Al-2 and 17.37 g ZnO-1. Mix with a dental mixer at 1500 revolutions per minute (RPM) for 2 minutes to achieve a flowable mixture. Transfer the flowable mixture to a contain and heat at 150° C. under vacuum (2.2 kiloPascals; 22 torr) for one hour to obtain Reference Sample A.

Samples 1-10: Thermally Conductive Materials. Prepare Samples 1-10 in the following way: Into a 100 mL dental cup add 7.26 g Matrix Material (See Table 3), 50.25 g Al-1, 25.12 g Al2 and 17.37 g ZnO1. Mix with a dental mixer at 1500 RPM for 2 minutes to provide a flowable mixture. Transfer the mixture to a metal container and heat to 150° C. under vacuum (2.2 kiloPascals; 22 torr) for one hour to provide the final Sample.

TABLE 3

| | Sample | | | | | | | | | |
|---|---|---|---|---|---|---|---|---|---|---|
| | 1 | 2 | 3 | 4 | 5 | 6 | 7 | 8 | 9 | 10 |
| Matrix Material | MM1 | MM2 | MM3 | MM4 | MM5 | MM6 | MM7 | MM8 | MM9 | MM10 |

Sample 11: Prepare in like manner as Sample 2 except use 13.00 g Matrix Material MM2, 47.13 g Al-1, 23.56 g Al-2, and 16.29 g ZnO-1.

Sample 12: Prepare in like manner as Sample 2 except use 15.00 g Matrix Material MM2, 46.06 g Al-1, 23.02 g Al-2, and 15.92 g ZnO-1.

II. Samples with Alumina-1, Alumina-2 and ZnO-1

Reference Sample B—Thermally Conductive Material with only Carrier Fluid matrix. Into a 100 milliliter (mL) dental cup, add 4.25 g Carrier Fluid 2, 1.5 g Carrier Fluid 3, 0.2 g Treating Agent 1, 0.8 g Treating Agent 3, 53.5 g Alumina-1, 26.7 g Alumina-2 and 12.8 g ZnO-1, 0.1 g Stabilizer, and 0.15 g Fumed Silica. Mix with a dental mixer at 1500 revolutions per minute (RPM) for 2 minutes to achieve a flowable mixture. Transfer the flowable mixture to a container and heat at 150° C. under vacuum (2.2 kiloPascals; 22 torr) for one hour to obtain Reference Sample B.

Sample 13: Thermally Conductive Material with Alumina-1 and Alumina-2. Prepare Sample 13 in the following way: Into a 100 mL dental cup add 5.9 g Matrix Material 11, 0.2 g Treating Agent 1, 0.8 g Treating Agent 3, 53.5 g Alumina-1, 26.7 g Alumina-2, 12.8 g ZnO-1 and 0.1 g Stabilizer. Mix with a dental mixer at 1500 RPM for 2 minutes to provide a flowable mixture. Transfer the mixture to a metal container and heat to 150° C. under vacuum (2.2 kiloPascals; 22 torr) for one hour to provide the final Sample.

Samples 14-17: Thermally Conductive Material with Alumina-3 and Alumina-4. These Samples explore ranges of thermally conductive filler loadings. Weights of each component are listed in Table 4. Into a 100 mL dental cup at the specified amount of MM2, Alumina-1, and Alumina-2. Mix with a dental mixer at 1500 RPM for 2 minutes to provide a flowable mixture. Transfer the mixture to a metal container and heat to 150° C. under vacuum (2.2 kiloPascals; 22 torr) for one hour to provide the final Sample.

TABLE 4

| Sample | MM2 (g) | Alumina-3 (g) | Alumina-4 (g) | Wt % Filler Loading |
|---|---|---|---|---|
| 14 | 7.80 | 31.3 | 20.9 | 87 |
| 15 | 9.00 | 30.6 | 20.4 | 85 |
| 16 | 10.80 | 29.5 | 19.7 | 82 |
| 17 | 12.00 | 28.8 | 19.2 | 80 |

Sample Evaluations

Evaluate the Samples by characterizing their viscosity at dilation, thermal conductivity and printability using the following methods:

Pump-Out Resistance. Evaluate pump-out resistance in a test mimicking a final application and the amount of pump-out is evaluated after accelerating power cycling. The Power cycling heats the electronic device for 5000 cycles of power cycling and simulates 5 years of device life at approximately 3 cycles per day. The device used for testing is a GPU card from Gigabyte that is powered by AMD Radeon™ RX VeEGA 64 GPU. Apply sample material to the GPU by: (1) dismantling the GPU card to expose both the heat sink and chipset sides; (2) carefully cleaning the residual TIM on both sides by using a swab or cleaning agent if necessary; (3) affix a screen stencil having a 200 micrometer thickness onto the heat sink to symmetrically match the position of the chipset; (4) stencil print through the stencil the sample material onto the chipset; and (5) remove the stencil and reassemble the GPU.

The following computer components are used for testing: CPU: AMD Ryzen 7 2700X 8-Core; Motherboard: ASUS TUF X470-PLIS GAMING; Memory: KINSTON DDR4 266 8 GB; Graphics Card: Gigabyte Radeon Computer Graphics Card (GV-RXVEGA64GAMING OC-8GD); Solid State Drive: Intel SSD 760P Series (256 GB, M.2 80 mm PCIe 3.0 x4, 3D2, TLC; Monitor: Del U2417H; Keyboard: Dell; Mouse: Dell: PC Case: Antec P8 ATX; Power Supply: Antec NEO750W; KVM: MT-viki HK05.

Conduct the thermal cycling test by running the FurMark GPU stress test software available for free download at: https://geeks3d.com/furmark/. A script (in AutoIt) includes steps to turn on and off Furmark software and steps to change fan speed in order to control the temperature of the GPU card. The AutoIt script includes: (1) Open Furmark Program; (2) Activate Furmark Stress Test Routine; (3) Turn fan speed to 30% of its maximum speed for 200,000 milliseconds for the heating cycle; (4) Stop Stress Test Routine; (5) Turn off Furmark Program; (6) Turn fan speed to 90% of its maximum speed for 200,000 milliseconds for the cool cycle; (7) repeat the sequence. The procedure is used to cycle the temperature on the GPU card from 35° C. to 85° C. and back down to 35° C. After running 5000 cycles, shut down the computer. Remove the graphics card. Open the graphics card and record with high-resolution camera on to Keyence VHX digital microscope the heat sink and die on the electronic board. Measure areas without sample material (bare spots) on both the heat sink and die due to pump-out during the cycling test. Calculate the quantitative area of the bare spots using readily available "sketchandcalc" software (or any equivalent software that can calculate are with digital imagery). The total bar spot area due to grease pump-out is divided by the total GPU die area (495 square millimeters) to determine % area of bare spot on the die. Results are classified as follows: EXCELLENT=less than 5% area of bare spot on the die; MODERATE=5-10% area of bare spot on the die; and BAD=greater than 10% area of bare spot on the die.

NOTE: for Samples B and 13 evaluate pump-out resistance using the following modified Pump-Out Resistance test. Prepare an assembly with 0.1 gram of sample material between glass and aluminum plates spaced 0.1 millimeter apart with 0.1 millimeter thick shims on either side of the sample material. Place the assembly in an oven and cycle between −40° C. and 125° C. at a rate of 30 minutes to go from one limit to the other and then hold for 30 minutes at each limit. Cycle for 168 hours and then evaluate coverage of the material over the aluminum plate under the glass slide: EXCELLENT=less than 5% bare spot area; MODERATE=>5% and <10% bare spot area; BAD=>10% bare spot area. Performance in this modified test is expected to correspond to the Pump-Out Resistance test described above.

Viscosity at Dilation. Measure dynamic using ASTM D4440-15 and model ARES-G2 device by TA Instruments that is equipped with 25 millimeter parallel plates (serrated steel). Testing conditions are based on strain sweep conducted at 25 degrees Celsius (° C.) with Strain: 0.01-300% and Frequency of 10 radians per second. Record the dynamic viscosity at the dilatant strain (dilatant point) as the viscosity at dilation.

Thermal Conductivity. Measure thermal conductivity according to ISO 22007-2:2015 using Hot Disk Instrument TPS 2500 S from Hot Disk AB, Götenborg, Sweden. Use sensor C5501. Fill two cups with sample material with the planar sensor held between the cups. Analysis conditions are: fine-tuned analysis, temperature drift compensation and time correction, calculation with selected points between points 50-150.

Printability Test. Screen print samples using an 80 mesh metal screen to print a pattern of 25 centimeters by 25 centimeters with 200 micrometer thickness onto a heat sink. Hold the screen above the heat sink and position 5 g of sample material on the top part of the screen. Use a squeegee held at 45° angle to the screen and heat sink moving at a constant speed and force to transfer the thermal grease through the screen onto the heatsink. Evaluate the screen printability of the sample using the following criteria: GOOD: The sample can be deposited on the heat sink for the full surface coverage; MEDIUM: Sample is deposited to cover only about 70-80% of the print surface area. Additional squeegee attempts are required to deposit sample onto the surface. Some material may be hung up in the screen mesh; BAD: Sample is deposited on less than 20% of the print surface area. Sample is too thick for good screen printability. The majority of the sample may be hung up in the screen mesh.

Results. Table 5 presents the results of the evaluation the samples. From these results the following conclusions are evident:

Samples 14-17 reveal that a loading of thermally conductive filler must be greater than 80 wt % in order to achieve the desired thermal conductivity of greater than one W/m*K.

Samples A and 1-4 reveal: (1) that crosslinked hydrosilylation reaction product must be present to achieve pump-out resistance; (2) that the weight ratio of Carrier Fluid to crosslinked hydrosilylation reaction product must be greater than 90/10 achieve adequate printability; and (3) the that degree of polymerization of the alkenyl terminated PDOS needs to be greater than 292 to achieve GOOD printability.

Samples B and 13 further reveal the need for the crosslinked hydrosilylation reaction product to achieve pump-out resistance.

TABLE 5

| Sample | Filler Loading (wt %) | Wt Ratio of Carrier Fluid to crosslinked hydrosilylation reaction product | SiH/Vi ratio | DP of AT PDOS | Thermal Conductivity (W/m * K) | Viscosity at Dilation (cP) | Printability | Pumpout Resistance |
|---|---|---|---|---|---|---|---|---|
| A | 92.74 | 0 | — | — | 5.2 | 104 | GOOD | BAD |
| 1 | 92.74 | 98/2 | 1.4:1 | 800 | 5.0 | 98 | GOOD | MODERATE |
| 2 | 92.74 | 95/5 | 1.4:1 | 800 | 4.9 | 118 | GOOD | EXCELLENT |
| 3 | 92.74 | 90/10 | 1.4:1 | 800 | 5.2 | 322 | BAD | BAD |
| 4 | 92.74 | 80/20 | 1.4:1 | 800 | — (a) | — (a) | BAD | — (B) |
| 5 | 92.74 | 95/5 | 0.5:1 | 800 | 5.0 | 104 | GOOD | MODERATE |
| 6 | 92.74 | 95/5 | 1:1 | 800 | 5.0 | 118 | GOOD | EXCELLENT |
| 7 | 92.74 | 95/5 | 2:1 | 800 | 5.2 | 154 | GOOD | BAD |
| 8 | 92.74 | 95/5 | 1.4:1 | 179 | 5.0 | 217 | BAD | MODERATE |
| 9 | 92.74 | 95/5 | 1.4:1 | 292 | 5.1 | 213 | BAD | BAD |
| 10 | 92.74 | 95/5 | 1.4:1 | 492 | 5.1 | 143 | MEDIUM | EXCELLENT |
| 11 | 87.00 | 95/5 | 1.4:1 | 800 | 2.4 | 12 | GOOD | — (c) |
| 12 | 85.00 | 95/5 | 1.4:1 | 800 | 2.2 | 8 | GOOD | — (c) |
| B | 93.00 | 0 | — | — | 3.7 | -NM- (e) | GOOD | BAD |
| 13 | 93.00 | 91/9 | 1:1 | 493 | 3.7 | -NM- (e) | GOOD | EXCELLENT |
| 14 | 87.00 | 95/5 | 1.4:1 | 800 | 1.7 | 3 | -NM- (d) | -NM- (d) |
| 15 | 85.00 | 95/5 | 1.4:1 | 800 | 1.5 | -NM- (d) | -NM- (d) | -NM- (d) |
| 16 | 82.00 | 95/5 | 1.4:1 | 800 | 1.2 | -NM- (d) | -NM- (d) | -NM- (d) |
| 17 | 80.00 | 95/5 | 1.4:1 | 800 | 1.0 | -NM- (d) | -NM- (d) | -NM- (d) |

(a) Not flowable so no viscosity or thermal conductivity could be measured.
(b) No thermal cycling was done due to poor printability.
(c) No thermal cycling was done due to low thermal conductivity.
(d) -NM- = non measured, sample done to explore thermal conductivity values.
(e) -NM- here indicates the Viscosity at Dilation was not measured, but the Printablility results indicate it is in the necessary range for printability.

The invention claimed is:

1. A non-curable thermally conductive material comprising:
   (a) a matrix material comprising:
      (i) greater than 90 weight-percent and at the same time 98 weight percent or less based on matrix material weight of a non-functional non-crosslinked organosiloxane fluid having a dynamic viscosity in a range of 50 to 350 centiStokes; and
      (ii) 2 to less than 10 weight-percent based on matrix material weight of a crosslinked hydrosilylation reaction product of an alkenyl terminated polydiorganosiloxane having a degree of polymerization that is greater than 300 and an organohydrogensiloxane crosslinker comprising on average 2 or more SiH groups per molecule where the ratio of the alkenyl terminated polydiorganosiloxane and organohydrogen siloxane is such that the molar ratio of SiH groups to alkenyl groups is in a range of 0.5 to 2.0;
   (b) greater than 80 weight-percent and at the same time less than 95 wt % based on non-curable thermally conductive material weight of a thermally conductive filler dispersed throughout the matrix material; and
   (c) treating agents selected from alkyltrialkoxy silanes where the alkyl contains from one to 14 carbon atoms and monotrialkoxy terminated diorganopolysiloxanes having a degree of polymerization in a range of 20 to 110 and the alkoxy groups each contain from one to 12 carbon atoms dispersed in the matrix material.

2. The non-curable thermally conductive material of claim 1, wherein the non-functional non-crosslinked organosiloxane fluid is a phenylmethylsiloxane-dimethylsiloxane copolymer.

3. The non-curable thermally conductive material of claim 1, wherein the alkenyl terminated polydiorganosiloxane has the following chemical structure (I):

$$ViR_2SiO\text{---}[R_2SiO]_x\text{---}SiR_2Vi \quad (I)$$

where Vi is a vinyl group and subscript x has an average value between 400 and 900 and R is independently in each occurrence selected from alkyl and aryl groups having from one to 8 carbon atoms.

4. The non-curable thermally conductive material of claim 1, wherein the organohydrogensiloxane crosslinker has the following chemical structure (II):

$$R_3SiO\text{---}[R_2SiO]_a\text{---}[HRSiO]_b\text{---}SiR_3 \quad (II)$$

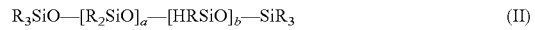

where R is independently in each occurrence selected from alkyl and aryl groups having from one to 8 carbon atoms; a has an average value in a range of 3-100; and b has an average value in a range of 2-30.

5. The non-curable thermally conductive material of claim 1, wherein the thermally conductive filler is any one or any combination of more than one of the following: spherical aluminum particles having an average size of 8 to 10 micrometers, spherical aluminum particles having an average particle size of one to 3 micrometers, zinc oxide particles having an average particle size of 0.10 to 0.15 micrometers, alumina particles have an average particle size of 10 to 20 micrometers, and spherical alumina particles have an average particle size of one to 5 micrometers.

6. The non-curable thermally conductive material of claim 1, wherein the non-curable thermally conductive material comprises both alkyltrimethoxy silane and monotrialkoxy terminated diorganopolysiloxane treating agents.

7. The non-curable thermally conductive material of claim 1, wherein the alkyltrimethoxy silane is n-decyltrimethoxysilane and the monotrialkoxy terminated diorganopolysiloxane has the following chemical structure: $(CH_3)_3Si[(CH_3)_2SiO]_m(OCH_3)_3$; where m has a value in a range of 30 to 110.

8. A process for making the non-curable thermally conductive material of claim 1, the process comprising the steps of: (a) combining the alkenyl terminated polydiorganosiloxane and organohydrogensiloxane crosslinker together with a hydrosilylation catalyst, the non-functional non-crosslinked organosiloxane fluid, the treating agent, and optionally, any or all of the thermally conductive filler; (b)

crosslinking the reactants to make the crosslinked hydrosilylation reaction product in the presence of the treating agent and, optionally, the thermally conductive filler; and (c) mixing in the thermally conductive filler to a concentration of greater than 80 weight-percent and at the same time less than 95 wt % based on the weight of combined materials if not already at that concentration.

9. An article comprising the non-curable thermally conductive material of claim 1 in thermal contact with at least two objects.

10. The article of claim 9, wherein one object is a bare die and another object is a heat sink.

\* \* \* \* \*